March 12, 1968 H. H. ROGERS 3,373,318

ELECTRICAL COMPONENT MOUNTING INCLUDING THERMAL COUPLING
AND ELECTRICAL ISOLATING MEANS

Filed June 25, 1965

INVENTOR.
HOWARD H. ROGERS

BY Donald W. [signature]

ATTORNEY

United States Patent Office 3,373,318
Patented Mar. 12, 1968

3,373,318
ELECTRICAL COMPONENT MOUNTING INCLUDING THERMAL COUPLING AND ELECTRICAL ISOLATING MEANS

Howard H. Rogers, Woodland Hills, Calif., assignor to North American Aviation, Inc.
Filed June 25, 1965, Ser. No. 466,968
4 Claims. (Cl. 317—101)

ABSTRACT OF THE DISCLOSURE

An electrically conductive mounting plate for mounting at least two electrical components such as transistors in heat conductive relationship. Leads of the elements extend from opposite portions of the plate and are separated physically by an intervening portion of the plate to achieve electrical isolation. The plate can act as a common connection for DC or low frequency components of a circuit.

This invention relates to mountings for electrical components.

More particularly, this invention relates to a mounting for transistors or similar electrical components. This mounting provides high thermal contact between two or more transistor elements while isolating them electrically.

There are many environments in electrical circuits in which it is either desirable or absolutely necessary that the electrical characteristics of two components vary simultaneously with each other with change in thermal environment. The change in thermal environment may be due to self heating by the transistors or to heating from other portions of the circuit. Since the electrical characteristics vary with temperature, it is sometimes necessary that as one element varies or "drifts," the other element should likewise vary or drift by the same amount during the same time interval. With the use of radio frequencies (RF) or high impedance circuits it is also necessary that a shield be provided to electrically isolate them due to the capacitance effect which is significant at high frequencies and/or high impedance levels. Thus, it is often necessary to provide a shield of metal for electrical isolation. While shields have been provided for electrical isolation between elements, it is also the case that capacitance effects between the leads of the components can interfere with the operation of the circuit.

The need for the same thermal environment as well as electrical isolation of components such as transistor elements is particularly marked in a heterodyne circuit when two transistor oscillators are used. In this case, it is necessary that the difference frequency remain constant even though the absolute frequencies may not. Another example is in a differential amplifier which must work at high frequencies and/or high impedance levels. In these cases, it also is necessary that the transistor characteristics do not change relative to one another. In these examples as well as others, the transistors must be mounted in the same thermal environment while electrical isolation is maintained.

The instant invention provides a mounting structure for two transistor elements which electrically isolates them as well as their leads while providing excellent thermal tracking. In its briefest aspect, the invention comprises a mounting plate having at least two elements such as transistors mounted therein, in heat conductive contact therewith, the leads of one element emanating from a side opposite the direction that the leads extend from the other element. The mounting plate is constructed of metal to provide excellent thermal tracking as well as electrical isolation. In addition, the plate can act as a common connection for DC or low frequency components of the circuit.

Accordingly, an object of this invention is to provide a structure for electrically isolating two electrical components while providing a high degree at thermal tracking.

Other objects and advantages of this invention will become apparent as this description proceeds taken in conjunction with the drawings in which.

Figure 1:
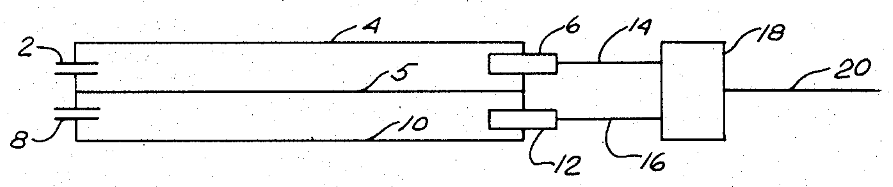
FIG. 1 is a schematic view of a typical circuit employing this invention.

Referring to FIG. 1, a schematic view of a typical circuit in which the instant invention is used is shown. Numerals 2 and 8 represent capacitors which control the frequency of oscillators 6 and 12 through connections 4, 10 and 5. The controlled signals from oscillators 6 and 12 pass through lines 14 and 16 into mixer 18 with the difference between the frequencies appearing at 20. Internal adjustments in oscillators 6 and 12 are provided to adjust oscillator frequency.

It is an essential feature of this circuit that the frequency is controlled solely by shifts in capacitors 2 and 8 and not by any shifts in oscillators 6 and 12 caused by environmental changes.

The capacitance of capacitors 2 and 8 can be controlled by many external influences such as capacitor pressure or distance between the capacitor plates. It can be appreciated that when the thermal environment of oscillators 6 and 12 differ, that their frequency response will vary relative to each other such that the difference in frequencies generated and then detected by mixer 18 will not represent the desired difference in the frequencies. It is not the absolute frequency generated by oscillators 6 and 12 that is the important criteria, but the difference in frequencies.

It is therefore incumbent to provide for high thermal tracking between the transistor elements of the oscillators. At high radio frequencies or in high impedance circuits, it is also incumbent to isolate electrically the transistor elements of the two oscillators.

Figure 2:
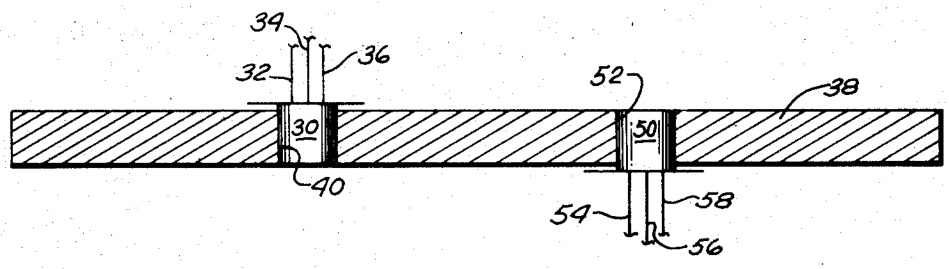
FIG. 2 is a view, partially in cross-section of the mounting and transistor assembly according to this invention.

FIG. 2 is illustrative of this invention. Transistor 30 of oscillator 6 having leads 32, 34 and 36 is mounted in mounting plate 38 by means of aperture 40 into which transistor 30 is press fit or otherwise secured. Mounting 38 is constructed of a metal such as silver, copper or aluminum to provide electrical isolation as well as high thermal conductivity.

Transistor 50 of oscillator 12 in like fashion is inserted within aperture 52 of mounting plate 38 with the important difference that leads 54, 56 and 58 emanate from the opposite side of mounting plate 38. Both transistors are in heat conductive contact with plate 35.

In this manner, capacitances effect between the leads of transistor 30 and those of transistor 50 is eliminated resulting in electrical isolation.

In operation, at high impedance levels or radio frequencies, mounting 38 acts as a heat conducting path so that transistors 30 and 50 are maintained at the same temperature at any given time as well as electrically isolating them. Further, mounting plate 38 may act as an integral portion of the circuit by varying DC or low frequency components as more clearly brought out in FIG. 3.

Figure 3:
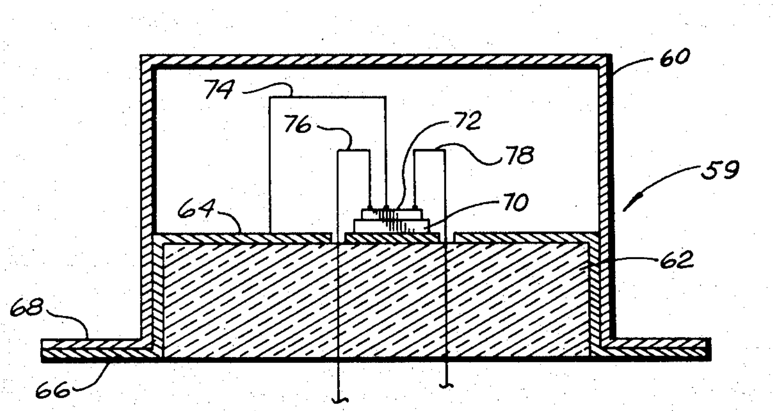
FIG. 3 is a view, partially in cross-section of a typical transistor assembly.

FIG. 3 is illustrative of a typical transistor assembly. The transistor assembly 59 which may correspond to transistor assembly 50 of FIG. 2 includes a metal shell or can 60. A metal shell 64 including a flange 66 which may be welded or otherwise secured to flange 68 of can 60 has mounted therein a glass block 62. Mounted on metal shell 64 is an aluminum plate 70 with a transistor element or chip 72 thereon. Leads 74, 76 and 78 extend from the transistor chip 72 with leads 76 and 78 extending through apertures in shell 64 and through glass block 62. Lead 74 which typically is the collector lead is electrically connected to metal shell 64 and thus to a mounting plate such as 38 in FIG. 2. Mounting plate 38 acts as an electric conductor as well as a thermal conductor and a capacitance shield. This is advantageous in those type of circuits in which a common collector oscillator circuit is used since the lead need only be grounded to the mounting plate for DC and low frequency connections. Other circuit configurations can be used wherein the emitter or base connections are grounded (collector isolated from shell).

Having described this invention, it is my intention to be limited only by the scope of the claims appended hereto.

I claim:

1. A multiple electrical component mounting assembly for electrically isolating a component and its leads from capacitive coupling with another component and its leads, the assembly comprising:

an electrically conductive plate, means forming at least two spaced openings in said plate, at least one electrical component positioned in each of said openings, at least one lead attached to each component, the lead from one component extending from a first portion of the plate and the lead from the other component extending from a second portion of the plate, said leads being physically separated from each other by a barrier comprising a third portion of said plate between said first and second portions, whereby the capacitive effect between components is substantially reduced and therefore interaction between components is minimized.

2. The assembly according to claim 1 wherein the leads extend from opposite sides of the plate.

3. The assembly according to claim 1 wherein the plate is metal and the components are disposed in heat conductive relationship through said metal plate to provide thermal equilibrium between components.

4. The assembly according to claim 3 wherein the components are transistors.

References Cited

UNITED STATES PATENTS

| | | | |
|---|---|---|---|
| 2,651,007 | 9/1953 | Shepard et al. | 317—101 |
| 2,836,772 | 5/1958 | Wintrode et al. | 317—101 |
| 3,109,880 | 11/1963 | Newby | 174—35 |
| 3,149,265 | 9/1964 | Thorn | 317—101 |
| 3,297,916 | 1/1967 | Wright | 317—100 |

ROBERT K. SCHAEFER, *Primary Examiner.*

J. R. SCOTT, *Assistant Examiner.*